United States Patent

[11] 3,587,003

[72] Inventor Jean Chastagnier
Brive, France
[21] Appl. No. 862,173
[22] Filed Sept. 30, 1969
[45] Patented June 22, 1971
[73] Assignee U. S. Philips Corporation
New York, N.Y.
[32] Priority Sept. 30, 1968
[33] France
[31] 168,121

[54] AN AUTOMATIC FREQUENCY CONTROL SYSTEM FOR A FREQUENCY MODULATION CIRCUIT HAVING AN ASYMMETRIC INPUT SIGNAL
5 Claims, 3 Drawing Figs.

[52] U.S. Cl. .................................... 332/19, 325/148, 331/23, 332/23
[51] Int. Cl. .................................... H03c 3/06
[50] Field of Search .................................... 332/19, 23, 16, 16 T; 331/23, 25; 325/147, 148

[56] References Cited
UNITED STATES PATENTS

| | | | |
|---|---|---|---|
| 2,555,150 | 5/1951 | Norton | 332/23 X |
| 2,662,214 | 12/1953 | Hugenholtz | 332/19 |
| 2,768,293 | 10/1956 | Hofweegan | 332/19 X |
| 3,030,582 | 4/1962 | Holcomb et al. | 332/19 X |
| 3,319,178 | 5/1967 | Broadhead | 331/25 X |

*Primary Examiner*—Alfred L. Brody
*Attorney*—Frank R. Trifari

ABSTRACT: An automatic frequency control system for a frequency modulation circuit comprising a voltage-controlled, frequency-modulated oscillator having an asymmetric input signal and a reference oscillator coupled to a comparison detection circuit, which feeds back a control voltage compensated by the mean value of the asymmetry of the signal input to the voltage-controlled oscillator so that the circuit's output frequency is always at a harmonic of the frequency of the reference oscillator.

INVENTOR.
JEAN CHASTAGNIER
BY
AGENT

INVENTOR.
JEAN CHASTAGNIER
BY
[signature]
AGENT

AN AUTOMATIC FREQUENCY CONTROL SYSTEM FOR A FREQUENCY MODULATION CIRCUIT HAVING AN ASYMMETRIC INPUT SIGNAL

The invention relates to a frequency modulation circuit comprising an oscillator which can be frequency modulated by modulation signal having a DC component a reference oscillator and a comparison detection circuit coupled to the oscillators. An output of said comparison detection circuit being coupled to an input of the oscillator which can be frequency modulated.

A circuit arrangement of the kind described above for asymmetric frequency modulation is known from French Pat. specification No. 1,381,500. The DC component in the modulation by a time-selective control circuit by means of which the frequency of the oscillator to be modulated is maintained, during the periodical occurrence of a reference level at a value associated with this reference level.

In such a time-selective control system strict requirements must be imposed upon the accuracy of the time selection circuit.

It is an object of the invention to provide a frequency modulation circuit which can be obtained in a less critical manner.

According to the invention a frequency modulation circuit of the kind described in the preamble is characterized in that the modulation signal input of the oscillator which can be frequency modulated is coupled to the comparison detection circuit at least through a mean value detection circuit.

In such a circuit arrangement a critical time-selective level measurement can be omitted.

In order that the invention may be readily carried into effect, a few embodiments thereof will now be described in detail, by way of example with reference to the accompanying drawing, in which:

In these figures corresponding elements are denoted by the same reference numerals.

FIG. 1 shows an embodiment of a circuit arrangement according to the invention.

Figure 1:
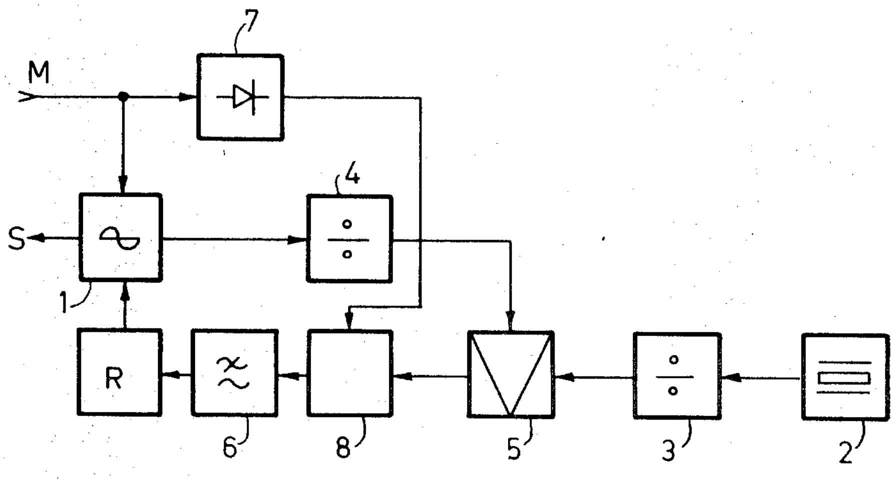
FIG. 1 is a block diagram of a circuit arrangement according to the invention for synchronizing an oscillator which can be frequency modulated asymmetrically.

An asymmetric modulation signal M with which the frequency modulation must be obtained is applied to a free-running oscillator 1 to be synchronized and to a detector 7, which detects the mean value of the modulation voltage, applying this voltage with the correct sign to an adding device 8. This adding device 8 furthermore receives the output signal from a phase discriminator 5 to which signals having frequencies originating from the oscillator 1 and a reference oscillator 2, and being divided by dividers 4 and 3 are applied. Detector 7, adding device 8, phase discriminator 5, and dividers 3 and 4 function as the comparison detection circuit.

The oscillator 1 is a free-running oscillator which generates a signal having a frequency $f_1$, which signal is to be synchronized with a signal of the frequency $f_2$ which is generated by the reference oscillator 2. The frequency of the output signal from the oscillator 1 is a harmonic of that of the output signal from the reference oscillator 2, notably $f_1=Nf_2$. The frequency of the signal obtained from this oscillator 2 is divided by a factor of $n$ in the divider 3, while the frequency of the signal obtained from the oscillator 1 is divided by a factor of $n{\cdot}N$ in the divider 4. These two signals of divided frequencies are applied to the phase discriminator 5 the output voltage of which is used as a so-called error voltage which serves for synchronizing the frequency of the oscillator 1. The control loop furthermore comprises a low pass filter 6 and a variable reactance R.

The output signal from the adding device 8 is applied through a low pass filter 6 to the variable reactance $R$ and controls the frequency of the oscillator 1. In spite of the fact that the oscillator 1 is modulated asymmetrically, the mean frequency of this oscillator is thus always a harmonic of that of the reference oscillator 2.

Figure 2:
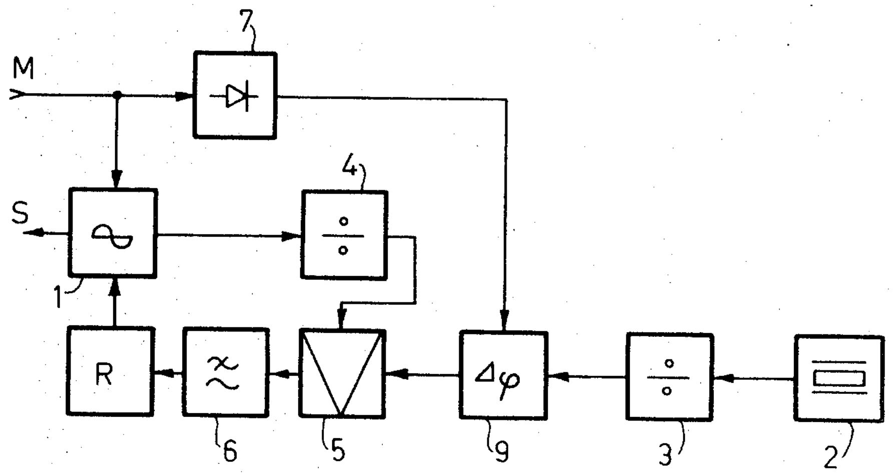
FIG. 2 is a block diagram of a further circuit arrangement according to the invention.

FIG. 2 shows a further embodiment of the circuit arrangement according to the invention. The mean value of the modulation voltage detected by the detector 7 is applied to a phase modulator $\Delta\ \Phi$ which is connected between the frequency divider 3 and the phase discriminator 5 and which receives a signal of the divided frequency from the reference oscillator 2.

The output signal of this phase modulator $\Delta\ \Phi$ is applied to one of the input terminals of the phase discriminator 5, while a signal of the frequency of the oscillator 1 to be synchronized and being divided by the divider 4 is applied to the other input terminal of this phase discriminator. As already stated the error voltage supplied by the phase discriminator 5 is utilized for synchronizing the frequency of the oscillator 1.

Figure 3:
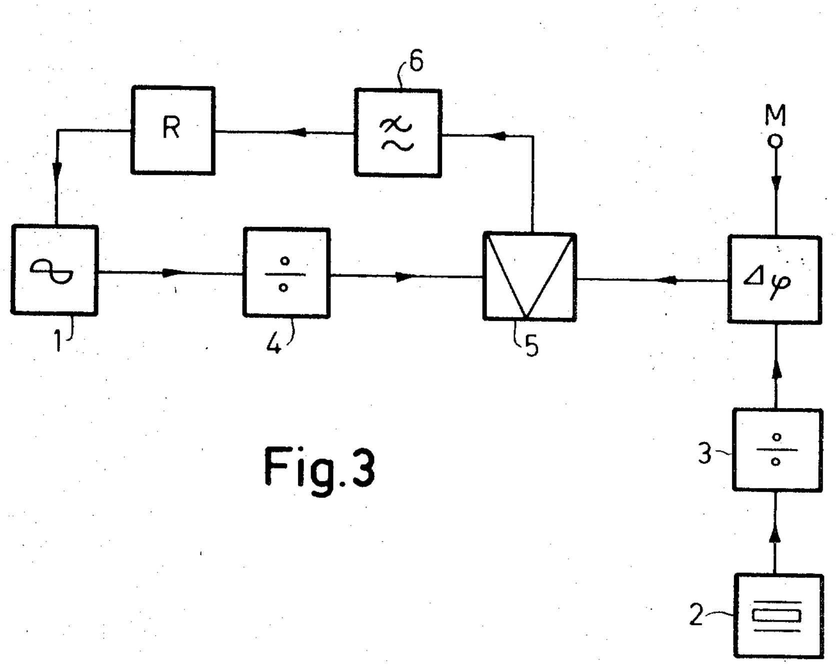
FIG. 3 is a block diagram of a third circuit arrangement according to the invention.

FIG. 3 shows a further embodiment of the circuit arrangement according to the invention. The modulation signal required for asymmetric frequency modulation is directly applied (with the correct screen phases) to the phase modulator $\Delta\ \Phi$ which receives a signal of the divided frequency from the reference oscillator 2. This signal of the divided frequency and phase modulated by the asymmetric modulation signal is applied to the phase discriminator 5. Furthermore a signal of the frequency divided by the divider 4 of the oscillator 1 to be synchronized is applied to this phase discriminator 5. The error voltage supplied by the phase discriminator 5 controls the variable reactance R through the low-pass filter 6 in order to synchronize the oscillator 1.

It is evident that the invention is not limited to the embodiments given by way of example, but that many variations are possible within the scope of the invention.

What I claim is:

1. An automatic frequency control system for a frequency modulation circuit, comprising input means for receiving asymmetric signals, a voltage-controlled oscillator for producing frequency-modulated output signals having frequency variations as determined by said input signals, a reference oscillator for producing signals at a constant frequency, comparison detection circuit means having separate input paths from each of said input means, said voltage-controlled oscillator and said reference oscillator to produce control voltages having values as determined by frequency differences between said voltage-controlled oscillator and said reference oscillator and by asymmetries of said input signal, and means for applying said control voltages to said voltage-controlled oscillator thereby to produce frequency-modulated output signals having a mean frequency value determined by said reference oscillator frequency.

2. An automatic frequency control system as claimed in claim wherein said comparison detection circuit means comprises voltage-controlled oscillator and reference oscillator frequency dividing means proportional to the frequency of said reference oscillator.

3. An automatic frequency control system as claimed in claim 1 wherein said comparison detection circuit means comprises means for comparing frequencies of said voltage-controlled oscillator and said reference oscillator to produce voltages having values representing the frequency differences thereof, detecting means for producing voltages having values representing the mean value of asymmetry of said input signals, and means for combining the voltages of said comparing means and said detecting means to produce said control voltages.

4. An automatic frequency control system as claimed in claim 1 wherein said comparison detection circuit means comprises detecting means for producing voltages representing the mean value of asymmetry of said input signals, phase modulator means for modifying the frequency of said reference oscillator by said detected voltages to provide for the asymmetry of said input signals, and phase discriminator means for comparing the frequency of said voltage-controlled oscillator with output signals of said phase modulator means to produce said control voltage.

5. An automatic frequency control system for a frequency modulation circuit comprising input means for receiving asymmetric signals, a reference oscillator for producing signals at a predetermined constant frequency, means for dividing the frequency of said reference oscillator, phase modulator means for modifying the divided frequency of said reference oscillator by said input signal to provide for the asymmetry of said input signal, voltage-controlled oscillator for producing frequency-modulated signals, means for dividing the frequency-modulated signals of said oscillator by a constant determined by the divided frequency of said reference oscillator, phase-discriminating means connected to said phase-modulating means and said voltage-controlled oscillator-dividing means to produce a value of voltage determined by the frequency differences thereof, and means for supplying said control voltage to said voltage-controlled oscillator thereby to produce frequency-modulated signals determined by said reference oscillator frequency.

PO-1050
(5/69)

UNITED STATES PATENT OFFICE
CERTIFICATE OF CORRECTION

Patent No. 3,587,003 Dated June 22, 1971

Inventor(s) JEAN CHASTAGNIER

It is certified that error appears in the above-identified patent and that said Letters Patent are hereby corrected as shown below:

Claim 2, line 52, after "claim" insert --1--

Signed and sealed this 9th day of November 1971.

(SEAL)
Attest:

EDWARD M.FLETCHER,JR.
Attesting Officer

ROBERT GOTTSCHALK
Acting Commissioner of Patents